(12) United States Patent
Li et al.

(10) Patent No.: US 8,309,640 B2
(45) Date of Patent: Nov. 13, 2012

(54) HIGH DIELECTRIC CONSTANT LASER DIRECT STRUCTURING MATERIALS

(75) Inventors: Yanjun (Frank) Li, Shanghai (CN); Jiru Meng, Shanghai (CN); David Xiangping Zou, Shanghai (CN)

(73) Assignee: Sabic Innovative Plastics IP B.V. (NL)

( * ) Notice: Subject to any disclaimer, the term of this patent is extended or adjusted under 35 U.S.C. 154(b) by 0 days.

(21) Appl. No.: 12/468,420

(22) Filed: May 19, 2009

(65) Prior Publication Data

US 2009/0292051 A1 Nov. 26, 2009

Related U.S. Application Data

(60) Provisional application No. 61/055,627, filed on May 23, 2008.

(51) Int. Cl.
*C08K 3/34* (2006.01)
*C08K 3/10* (2006.01)
*C08K 3/38* (2006.01)
*C08K 3/00* (2006.01)
*C08K 3/28* (2006.01)
*C08L 77/00* (2006.01)

(52) U.S. Cl. ........ 524/404; 524/430; 524/606; 524/612; 524/434; 524/442; 524/428

(58) Field of Classification Search .................. 524/404, 524/606, 612, 434, 430, 442, 424, 428
See application file for complete search history.

(56) References Cited

U.S. PATENT DOCUMENTS

| | | | |
|---|---|---|---|
| 4,603,166 A | 7/1986 | Poppe et al. | |
| 4,617,342 A | 10/1986 | Poppe et al. | |
| 4,806,297 A | 2/1989 | Brown et al. | |
| 4,879,065 A | 11/1989 | Sterzel | |
| 5,709,960 A | 1/1998 | Mays et al. | |
| 5,848,327 A * | 12/1998 | Badesha et al. | 399/99 |
| 6,075,223 A | 6/2000 | Harrison | |
| 6,207,344 B1 | 3/2001 | Ramlow et al. | |
| 6,313,436 B1 | 11/2001 | Harrison | |
| 6,420,476 B1 * | 7/2002 | Yamada et al. | 524/575 |
| 6,521,688 B1 | 2/2003 | Linzmeier et al. | |
| 6,706,785 B1 | 3/2004 | Fu | |
| 7,060,421 B2 | 6/2006 | Naundorf et al. | |
| 7,112,365 B2 | 9/2006 | Kliesch et al. | |
| 7,223,807 B2 | 5/2007 | Okamoto et al. | |
| 7,504,150 B2 | 3/2009 | Lee et al. | |
| 2004/0241142 A1 | 12/2004 | Johnson et al. | |
| 2004/0241422 A1 * | 12/2004 | Naundorf et al. | 428/323 |
| 2005/0064711 A1 * | 3/2005 | Kliesch et al. | 438/689 |
| 2005/0069688 A1 | 3/2005 | Kliesch et al. | |
| 2006/0286365 A1 | 12/2006 | Lee et al. | |
| 2008/0015320 A1 | 1/2008 | Lee et al. | |
| 2008/0149922 A1 | 6/2008 | Lin et al. | |
| 2008/0171181 A1 | 7/2008 | Zaderej | |
| 2009/0017309 A1 | 1/2009 | Lee et al. | |
| 2009/0054553 A1 | 2/2009 | Meng et al. | |

FOREIGN PATENT DOCUMENTS

| | | |
|---|---|---|
| EP | 0121983 A2 | 10/1984 |
| EP | 0121984 A2 | 10/1984 |
| EP | 0121985 A2 | 10/1984 |
| EP | 0122688 A2 | 10/1984 |
| EP | 0395414 A1 | 10/1990 |
| EP | 753536 | 1/1997 |
| EP | 767257 | 4/1997 |
| EP | 1650249 | 4/2006 |
| EP | 1734545 | 12/2006 |
| EP | 1912227 | 1/2009 |
| JP | 2004006316 A | 8/2004 |
| WO | 9925562 | 5/1999 |
| WO | 2007079156 | 7/2007 |
| WO | 2008088725 | 7/2008 |
| WO | 2009024496 | 2/2009 |

OTHER PUBLICATIONS

BASF "Ultramid T 4381 LDS", Jan. 2007, URL:http://www.plasticsportal.net/wa/plastics EU{en_GB/function/conversions:/publish/common/upload/engineering_plastics/Ultramid_T4381LDS.pdf.*

* cited by examiner

*Primary Examiner* — Michael M Bernshteyn
(74) *Attorney, Agent, or Firm* — Cantor Colburn LLP

(57) ABSTRACT

High dielectric constant thermoplastic compositions that are capable of being used in a laser direct structuring process. The compositions include a thermoplastic base resin, a laser direct structuring additive, and at least one ceramic filler. The compositions provide a high dielectric constant, low loss tangent thermoplastic composition. The compositions can be used in a variety of applications such as personal computers, notebook and portable computers, cell phone antennas and other such communications equipment, medical applications, RFID applications, and automotive applications.

7 Claims, No Drawings

HIGH DIELECTRIC CONSTANT LASER DIRECT STRUCTURING MATERIALS

CROSS REFERENCE TO RELATED APPLICATIONS

The present application claims priority to U.S. Provisional Patent Application No. 61/055,627 filed May 23, 2008, which is hereby incorporated by reference in its entirety.

FIELD OF THE INVENTION

The present invention relates to thermoplastic compositions, and in particular to high dielectric constant thermoplastic compositions capable of being used in a laser direct structuring process. The present invention also relates to methods of manufacturing these compositions and articles that include these compositions.

BACKGROUND OF THE INVENTION

Electrical components may be provided as molded injection devices (MID) with desired printed conductors, i.e., when manufactured in MID technology, using different methods, e.g., a masking method, in two-component injection molding with subsequent electroplating (or electroless plating), because for some cases, chemical plating is used for 2-component injection molding. In contrast to conventional circuit boards made of fiberglass-reinforced plastic or the like, MID components manufactured in this way are three-dimensional molded parts having an integrated printed conductor layout and possibly further electronic or electromechanical components. The use of MID components of this type, even if the components have only printed conductors and are used to replace conventional wiring inside an electrical or electronic device, saves space, allowing the relevant device to be made smaller, and lowers the manufacturing costs by reducing the number of assembly and contacting steps. These MID devices have great utility in cell phones, PDAs and notebook applications.

Stamp metal, flexible printed circuit board (FPCB) mounted and two-shot molding methods are three existing technologies to make an MID. However, stamping and FPCB mounted process have limitations in the pattern geometry, and the tooling is expensive and also altering of a RF pattern causes high-priced and time-consuming modifications into tooling. 2-shot-molding (two-component injection molding) processes have been used to produce 3 D-MIDs with real three-dimensional structures. The antenna can be formed with subsequent chemical corrosion, chemical surface activation and selective metal coating. This method involves high initial costs and is only economically viable for large production numbers. 2-shot-molding is also not environmentally friendly process. All these three methods are tool-based technologies, which have limited flexibility, long development cycles, difficult prototype, expensive design changes, and limited miniaturization.

Accordingly, it is becoming increasingly popular to form MIDs using a laser direct structuring (LDS) process. In an LDS process a computer-controlled laser beam travels over the MID to activate the plastic surface at locations where the conductive path is to be situated. With a laser direct structuring process, it is possible to obtain small conductive path widths (such as of 150 microns or less). In addition, the spacing between the conductive paths may also be small. As a result, MIDs formed from this process save space and weight in the end-use applications. Another advantage of laser direct structuring is its flexibility. If the design of the circuit is changed, it is simply a matter of reprogramming the computer that controls the laser.

However, for some type of applications, such as antennas, a high dielectric constant (Dk) and/or low loss tangent (also known as a dissipation factor, Df) are beneficial characteristics. A high Dk would enable the reduction of the size of the antenna while a low Df minimizes energy loss (heat) and/or maximizes the energy radiated. Current prior art materials have yet to provide an LDS material having a high Dk and low Df.

Accordingly, it would be beneficial to provide a high dielectric constant, low loss tangent thermoplastic composition that is capable of being used in a laser direct structuring process. It would also be beneficial to provide a high dielectric constant, low loss tangent thermoplastic composition that is capable of being used in notebook applications, such as for notebook antennas. It would also be beneficial to provide a thermoplastic composition that is capable of being used in a laser direct structuring process to provide a solution to the longer molding times currently used to form certain applications, such as for notebook antennas. It would also be beneficial to provide a method of making a high dielectric constant, low loss tangent thermoplastic composition. It would also be beneficial to provide an article made from a high dielectric constant, low loss tangent thermoplastic composition.

BRIEF SUMMARY OF THE INVENTION

The present invention provides a high dielectric constant, low loss tangent thermoplastic composition capable of being used in a laser direct structuring process. The compositions of the present invention include a thermoplastic resin, such as a polyamide-based resin, a polyphthalamide resin, a polyphenylene oxide resin or the like; a laser direct structuring additive and at least one ceramic filler having a high dielectric constant. The compositions are capable of being used in a laser direct structuring process while also providing a low loss tangent while also maintaining a high dielectric constant. These compositions may be used in a variety of products such as, for example, electrical and electronic parts, personal computers, notebook and portable computers, cell phone and other such communications equipment.

Accordingly, in one aspect, the present invention provides a thermoplastic composition including from 10 to 90% by weight of a thermoplastic base resin, from 0.1 to 30% by weight of a laser direct structuring additive, and 10 to 80% or less by weight of at least one ceramic filler having a high dielectric constant; wherein the thermoplastic compositions are capable of being plated after being activated using a laser.

In another aspect, the present invention provides a method of forming a thermoplastic composition including the step of blending in an extruder from 10 to 90% by weight of a thermoplastic base resin, from 0.1 to 30% by weight of a laser direct structuring additive, and 10 to 80% or less by weight of at least one ceramic filler having a high dielectric constant; wherein the thermoplastic compositions are capable of being plated after being activated using a laser.

In yet another aspect, the present invention provides an article of manufacture that includes a composition including from 10 to 90% by weight of a thermoplastic base resin, from 0.1 to 30% by weight of a laser direct structuring additive, and 10 to 80% or less by weight of at least one ceramic filler having a high dielectric constant; wherein the thermoplastic compositions are capable of being plated after being activated using a laser.

DETAILED DESCRIPTION OF THE INVENTION

The present invention is more particularly described in the following description and examples that are intended to be illustrative only since numerous modifications and variations therein will be apparent to those skilled in the art. As used in the specification and in the claims, the term "comprising" may include the embodiments "consisting of" and "consisting essentially of." All ranges disclosed herein are inclusive of the endpoints and are independently combinable. The endpoints of the ranges and any values disclosed herein are not limited to the precise range or value; they are sufficiently imprecise to include values approximating these ranges and/or values.

As used herein, approximating language may be applied to modify any quantitative representation that may vary without resulting in a change in the basic function to which it is related. Accordingly, a value modified by a term or terms, such as "about" and "substantially," may not be limited to the precise value specified, in some cases. In at least some instances, the approximating language may correspond to the precision of an instrument for measuring the value.

The present invention provides a high dielectric constant, low loss tangent thermoplastic composition capable of being used in a laser direct structuring process. The compositions include a thermoplastic resin, a laser direct structuring additive and at least one ceramic filler having a high dielectric constant. The thermoplastic resin may include a polyether-based resin, a nylon-based resin, a polyphthalamide resin, a polyphenylene oxide resin or a combination including at least one of the foregoing resins.

Accordingly, in one embodiment, the thermoplastic compositions of the present invention include a nylon-based resin, such as a polyamide resin. Polyamides are generally derived from the polymerization of organic lactams having from 4 to 12 carbon atoms. In one embodiment, the lactams are represented by the formula (I)

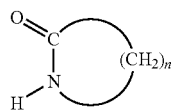
(I)

wherein n is 3 to 11. In one embodiment, the lactam is epsilon-caprolactam having n equal to 5.

Polyamides may also be synthesized from amino acids having from 4 to 12 carbon atoms. In one embodiment, the amino acids are represented by the formula (II)

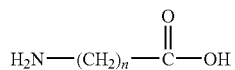
(II)

wherein n is 3 to 11. In one embodiment, the amino acid is epsilon-aminocaproic acid with n equal to 5.

Polyamides may also be polymerized from aliphatic dicarboxylic acids having from 4 to 12 carbon atoms and aliphatic diamines having from 2 to 12 carbon atoms. In one embodiment, the aliphatic diamines are represented by the formula (III)

(III)

wherein n is about 2 to about 12. In one embodiment, the aliphatic diamine is hexamethylenediamine ($H_2N(CH_2)_6NH_2$). In one embodiment, the molar ratio of the dicarboxylic acid to the diamine is from 0.66 to 1.5. Within this range it is generally beneficial to have the molar ratio be greater than or equal to 0.81. In another embodiment, the molar ratio is greater than or equal to 0.96. In yet another embodiment, the molar ratio is less than or equal to 1.22. In still another embodiment, the molar ratio is less than or equal to 1.04. Examples of polyamides that are useful in the present invention include, but are not limited to, nylon 6, nylon 6,6, nylon 4,6, nylon 6, 12, nylon 10, or the like, or combinations including at least one of the foregoing polyamides.

Synthesis of polyamideesters may also be accomplished from aliphatic lactones having from 4 to 12 carbon atoms and aliphatic lactams having from 4 to 12 carbon atoms. The ratio of aliphatic lactone to aliphatic lactam may vary widely depending on the selected composition of the final copolymer, as well as the relative reactivity of the lactone and the lactam. In one embodiment, the initial molar ratio of aliphatic lactam to aliphatic lactone is 0.5 to 4. Within this range a molar ratio of greater than or equal to about 1 is beneficial. In another embodiment, a molar ratio of less than or equal to 2 is utilized.

The conductive precursor composition may further include a catalyst or an initiator. Generally, any known catalyst or initiator suitable for the corresponding thermal polymerization may be used. Alternatively, the polymerization may be conducted without a catalyst or initiator. For example, in the synthesis of polyamides from aliphatic dicarboxylic acids and aliphatic diamines, no catalyst may be used in select embodiments.

For the synthesis of polyamides from lactams, suitable catalysts include water and the omega-amino acids corresponding to the ring-opened (hydrolyzed) lactam used in the synthesis. Other suitable catalysts include metallic aluminum alkylates ($MAl(OR)_3H$; wherein M is an alkali metal or alkaline earth metal, and R is $C_1$-$C_{12}$ alkyl), sodium dihydrobis (2-methoxyethoxy)aluminate, lithium dihydrobis(tert-butoxy)aluminate, aluminum alkylates ($Al(OR)_2R$; wherein R is $C_1$-$C_{12}$ alkyl), N-sodium caprolactam, magnesium chloride or bromide salt of epsilon-caprolactam ($MgXC_6H_{10}NO$, X=Br or Cl), dialkoxy aluminum hydride. Suitable initiators include isophthaloybiscaprolactam, N-acetalcaprolactam, isocyanate epsilon-caprolactam adducts, alcohols (ROH; wherein R is $C_1$-$C_{12}$ alkyl), diols (HO—R—OH; wherein R is R is $C_1$-$C_{12}$ alkylene), omega-aminocaproic acids, and sodium methoxide.

For the synthesis of polyamideesters from lactones and lactams, suitable catalysts include metal hydride compounds, such as a lithium aluminum hydride catalysts having the formula $LiAl(H)_x(R^1)_y$, where x is 1 to 4, y is 0 to 3, x+y is equal to 4, and $R^1$ is selected from the group consisting of $C_1$-$C_{12}$ alkyl and $C_1$-$C_{12}$ alkoxy; highly beneficial catalysts include $LiAl(H)(OR^2)_3$, wherein $R^2$ is selected from $C_1$-$C_8$ alkyl; an especially beneficial catalyst is $LiAl(H)(OC(CH_3)_3)_3$. Other suitable catalysts and initiators include those described above for the polymerization of poly(epsilon-caprolactam) and poly(epsilon-caprolactone).

In yet another embodiment, the thermoplastic compositions of the present invention include a poly(arylene ether) resin. As used herein, a "poly(arylene ether)" includes a plurality of structural units of the formula (IV):

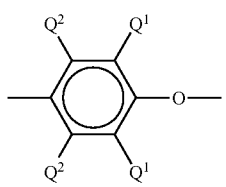

(IV)

wherein for each structural unit, each $Q^1$ is independently halogen, primary or secondary lower alkyl (e.g., an alkyl containing 1 to 7 carbon atoms), phenyl, haloalkyl, aminoalkyl, alkenylalkyl, alkynylalkyl, hydrocarbonoxy, and halohydrocarbonoxy wherein at least two carbon atoms separate the halogen and oxygen atoms; and each $Q^2$ is independently hydrogen, halogen, primary or secondary lower alkyl, phenyl, haloalkyl, aminoalkyl, alkenylalkyl, alkynylalkyl, hydrocarbonoxy, halohydrocarbonoxy wherein at least two carbon atoms separate the halogen and oxygen atoms. In some embodiments, each $Q^1$ is independently alkyl or phenyl, for example, $C_{1-4}$ alkyl, and each $Q^2$ is independently hydrogen or methyl. The poly(arylene ether) may include molecules having aminoalkyl-containing end group(s), typically located in an ortho position to the hydroxy group. Also frequently present are 4-hydroxybiphenyl end groups, typically obtained from reaction mixtures in which a by-product diphenoquinone is present.

The poly(arylene ether) may be in the form of a homopolymer; a copolymer; a graft copolymer; an ionomer; a block copolymer, for example comprising arylene ether units and blocks derived from alkenyl aromatic compounds; as well as combinations comprising at least one of the foregoing. Poly (arylene ether) includes polyphenylene ether containing 2,6-dimethyl-1,4-phenylene ether units optionally in combination with 2,3,6-trimethyl-1,4-phenylene ether units.

The poly(arylene ether) may be prepared by the oxidative coupling of monohydroxyaromatic compound(s) such as 2,6-xylenol and/or 2,3,6-trimethylphenol. Catalyst systems are generally employed for such coupling; they can contain heavy metal compound(s) such as a copper, manganese or cobalt compound, usually in combination with various other materials such as a secondary amine, tertiary amine, halide or combination of two or more of the foregoing.

The poly(arylene ether) can have a number average molecular weight of 3,000 to 40,000 atomic mass units (amu) and a weight average molecular weight of 5,000 to 80,000 amu, as determined by gel permeation chromatography. The poly(arylene ether) can have an intrinsic viscosity of 0.10 to 0.60 deciliters per gram (dl/g), or, more specifically, 0.29 to 0.48 dl/g, as measured in chloroform at 25° C. It is possible to utilize a combination of high intrinsic viscosity poly(arylene ether) and a low intrinsic viscosity poly(arylene ether). Determining an exact ratio, when two intrinsic viscosities are used, will depend somewhat on the exact intrinsic viscosities of the poly(arylene ether) used and the ultimate physical properties that are selected.

Examples polyphenylene ether polymers that may be used in the present invention include, but are not limited to, poly (2,6-dimethyl-1,4-phenylene)ether; poly(2,3,6-trimethyl-1, 4-phenylene) ether; poly(2,6-diethyl-1,4-phenylene)ether; poly(2-methyl-6-propyl-1,4-phenylene) ether; poly(2,6-dipropyl-1,4-phenylene)ether; poly(2-ethyl-6-propyl-1,4-phenylene)ether; poly(2,6-dilauryl-1,4-phenylene)ether; poly(2,6-diphenyl-1,4-phenylene)ether; poly(2,6-dimethoxy-1,4-phenylene)ether; poly(2,6-diethoxy-1,4-phenylene)ether; poly(2-methoxy-6-ethoxy-1,4-phenylene) ether; poly(2-ethyl-6-stearyloxy-1,4-phenylene)ether; poly (2,6-dichloro-1,4-phenylene)ether; poly(2-methyl-6-phenyl-1,4-phenylene)ether; poly(2,6-dibenzyl-1,4-phenylene) ether; poly(2-ethoxy-1,4-phenylene)ether; poly(2-chloro-1, 4-phenylene) ether; poly(2,6-dibromo-1,4-phenylene)ether; poly(3-bromo-2,6-dimethyl-1,4-phenylene)ether, copolymers thereof and mixtures thereof, and the like. In select embodiments, polyphenylene ether polymers for use in the compositions of the present invention include poly(2,6-dimethyl-1,4-phenylene)ether, poly(2,3,6-trimethyl-1,4-phenylene)ether, blends of these polymers and copolymers including units of 2,3,6-trimethyl-1,4-phenylene ether and units of 2,6-dimethyl-1,4-phenylene ether. Examples of such polymers and copolymers are also set forth in U.S. Pat. No. 4,806,297.

In yet another embodiment, the thermoplastic compositions of the present invention include a polyphthalamide resin. The polyphthalamide, in one embodiment, includes the reaction product of (i) hexamethylene diamine or a mixture of hexamethylene diamine and trimethyl hexamethylene diamine, and (ii) terephthalic acid, and optionally (iii) at least one acid selected from isophthalic acid or adipic acid, provided that a mixture of the diamines is employed if reactant (iii) is absent. These polyphthalamides are generally crystalline in nature and exhibit improved tensile strength and high heat deflection temperatures. These polyphthalamides, and methods for their preparation, are disclosed in U.S. Pat. Nos. 4,603,166 and 4,617,342, and in European Patent Applications Nos. 121,983, 121,984, 121,985, 122,688 and 395,414.

For example, U.S. Pat. No. 4,603,166 and European Patent Application No. 121,984 disclose polyphthalamides prepared from hexamethylene diamine, terephthalic acid and adipic acid and from hexamethylene diamine, terephthalic acid, isophthalic acid and adipic acid. The hexamethylene diamine:terephthalic acid:isophthalic acid:adipic acid mole ratio employed therein is in the range of about 100:65-95:25-0:35-5. U.S. Pat. No. 4,617,342 and European Patent Application No. 122,688 disclose polyphthalamides formed from a mixture of hexamethylene diamine and trimethyl hexamethylene diamine in a molar ratio of from about 98:2 to about 60:4 and a mixture of terephthalic acid and isophthalic acid in a molar ratio of at least 80:20 to about 99:1. European Patent Application No. 121,985 discloses polyphthalamides prepared from a mixture of hexamethylene diamine and trimethyl hexamethylene diamine in a mole ratio of from about 55/45 to about 95/5 and terephthalic acid. The mole ratio of the terephthalic acid to the diamines is preferably in the range of 1.2:1 to 1:1.2, and more preferably about 1:1. European Patent Application No. 121,983 discloses polyphthalamides prepared from mixtures of hexamethylene diamine and trimethyl hexamethylene diamine and mixtures of terephthalic acid and adipic acid or mixtures of terephthalic acid, isophthalic acid and adipic acid. The mole ratio of hexamethylene diamine to trimethyl hexamethylene diamine is in the range of about 55/45 to about 98/2. When a mixture of terephthalic acid and adipic acid is employed, the mole ratio of the diamines, terephthalic acid and adipic acid is in the range of about 100/61/39 to 100/95/5. When the mixture of terephthalic acid, isophthalic acid and adipic acid is employed, the mole ratio of the diamines, terephthalic acid and a mixture of isophthalic acid and adipic acid is in the range of about 100/61/39 to 100/95/5, with the molar ratio of isophthalic acid to adipic acid in the mixture being about 38/1 to 1/38. Any of these crystalline polyphthalamides are suitable for use in the compositions of the present invention and may be prepared in accordance with the teachings of the aforementioned Poppe et al U.S. patents and the cited European patent applications.

The amount of the thermoplastic resin used in the thermoplastic compositions of the present invention may be based on the selected properties of the thermoplastic compositions as well as molded articles made from these compositions. Other factors include the type and/or amount of the LDS additive used and/or the type and/or amount of the ceramic filler used. In one embodiment, the thermoplastic resin is present in amounts of from 10 to 90 wt. %. In another embodiment, the thermoplastic resin is present in amounts from 20 to 80 wt. %. In still another embodiment, the thermoplastic resin is present in amounts from 30 to 70 wt. %.

In addition to the thermoplastic resin, the compositions of the present invention also include a laser direct structuring (LDS) additive. The LDS additive is selected to enable the composition to be used in a laser direct structuring process. In an LDS process, a laser beam exposes the LDS additive to place it at the surface of the thermoplastic composition and to activate metal atoms from the LDS additive. As such, the LDS additive is selected such that, upon exposed to a laser beam, metal atoms are activated and exposed and in areas not exposed by the laser beam, no metal atoms are exposed. In addition, the LDS additive is selected such that, after being exposed to laser beam, the etching area is capable of being plated to form conductive structure. As used herein "capable of being plated" refers to a material wherein a substantially uniform metal plating layer can be plated on laser-etched area and show a wide window for laser parameters.

In addition to enabling the composition to be used in a laser direct structuring process, the LDS additive used in the present invention is also selected to help increase the dielectric constant and lower the loss tangent by acting as a synergist with the ceramic filler. In general, high Dk, low Df compounds using ceramic fillers alone cannot be used to produce an antenna by using LDS technology. However, it has been found that the addition of an LDS additive, such as copper chromium oxide spinel, when added together with the ceramic fillers, the metal seeds can be formed by the LDS process and the conductor track structures can be arranged on these high Dk low Df materials by subsequent plating after activation by the laser during the LDS process. Breaking down copper chromium oxide spinel forms heavy-metal nuclei during activation with the laser during the LDS process. These nuclei enable the material to then be plated by enabling adhesion of the metallization layer in metallization process. As such, the resulting materials have a low loss tangent. In one embodiment, the material has a loss tangent of 0.01 or less.

In addition, it has been found that the LDS additive provides a synergistic effect on the dielectric constant of the material. If no LDS additive is used, then, with ceramic fillers alone, in order to get certain level of dielectric constant, a high ceramic filler loading is necessary. As a result, the specific gravity of the materials is higher. However, by adding the LDS additive, it is possible to achieve the same level of dielectric constant using a small amount of LDS additive with a reduced ceramic filler loading. As a result, lower total filler loadings can be achieved as well as a lower specific gravity. As such, the weight of molded parts will be reduced, resulting in lighter, less expensive products.

Examples of LDS additives useful in the present invention include, but are not limited to, a heavy metal mixture oxide spinel, such as copper chromium oxide spinel; a copper salt, such as copper hydroxide phosphate copper phosphate, copper sulfate, cuprous thiocyanate; or a combination including at least one of the foregoing LDS additives.

In one embodiment, the LDS additive is a heavy metal mixture oxide spinel, such as copper chromium. The use of the heavy metal mixture oxide spinel enables the composition to be used in a laser direct structuring process while also enhancing the dielectric constant characteristics of the composition such that lower amounts of the ceramic filler are used, thereby improving the reducing the specific gravity of the material and providing a material having a low loss tangent. In one embodiment, the LDS additive is present in amounts of from 0.1 to 30 wt. %. In another embodiment, the LDS additive is present in amounts from 0.2 to 15 wt. %. In still another embodiment, the LDS additive is present in amounts from 0.5 to 10 wt. %.

As discussed, the LDS additive is selected such that, after activating with a laser, the conductive path can be formed by followed a standard electroless plating process. When the LDS additive is exposed to the laser, elemental metal is released. The laser draws the circuit pattern onto the part and leaves behind a roughened surface containing embedded metal particles. These particles act as nuclei for the crystal growth during a subsequent plating process, such as a copper plating process. Other electroless plating processes that may be used include, but are not limited to, gold plating, nickel plating, silver plating, zinc plating, tin plating or the like.

In addition to the foregoing components, the thermoplastic compositions of the present invention further include at least one ceramic filler having a high dielectric constant. The ceramic filler is provided to help increase dielectric constant of the materials. As discussed, the LDS additives also help increase the dielectric constant of the compounds. Therefore, less ceramic filler is needed to achieve the same levels of dielectric constant due to the synergistic effects between the ceramic filler and the LDS additive. As such, higher dielectric constant materials may be achieved and/or lower loadings of ceramic filler may be used to lower the specific gravity of the materials, thereby resulting in a low loss tangent material.

The high dielectric constant ceramic filler has, in one embodiment, a dielectric constant of 25 or greater when measured at 900 MHz or greater and can include inorganic oxides, metal oxides, silicates, borides, carbides, nitrides, perovskites and perovskites derivatives, or the like, or a combination including at least one of the foregoing fillers having a dielectric constant of 25 or greater when measured at 900 MHz. As such, the resulting compositions have a dielectric constant of 4 or greater.

Examples of inorganic oxides include calcium oxide, silicon dioxide, or the like, or a combination including at least one of the foregoing inorganic oxides. In one embodiment, the ceramic filler includes metal oxides of alkali metals, alkaline earth metals, transition metals, metalloids, poor metals, or the like, or a combination including at least one of the foregoing. Examples of metal oxides include zirconates, titanates, aluminates, stannates, niobates, tantalates, rare earth oxides or the like, or a combination including at least one of the foregoing.

Examples of metal oxides are cerium oxide, magnesium oxide, titanium oxide, zinc oxide, copper oxide, cerium oxide, niobium oxide, tantalum oxide, yttrium oxide, zirconium oxide, aluminum oxide (e.g., alumina and/or fumed alumina), $CaTiO_3$, $MgZrSrTiO_6$, $MgTiO_3$, $MgAl_2O_4$, $BaZrO_3$, $BaSnO_3$, $BaNb_2O_6$, $BaTa_2O_6$, $WO_3$, $MnO_2$, $SrZrO_3$, $SnTiO_4$, $ZrTiO_4$, $CaZrO_3$, $CaSnO_3$, $CaWO_4$, $MgTa_2O_6$, $MgZrO_3$, $La_2O_3$, $CaZrO_3$, $MgSnO_3$, $MgNb_2O_6$, $SrNb_2O_6$, $MgTa_2O_6$, $Ta_2O_3$, or the like, or a combination including at least one of the foregoing metal oxides.

Examples of silicates are $Na_2SiO_3$, $LiAlSiO_4$, $Li_4SiO_4$, $BaTiSi_3O_9$, $Al_2Si_2O_7$, $ZrSiO_4$, $KAlSi_3O_8$, $NaAlSi_3O_8$, $CaAl_2Si_2O_8$, $CaMgSi_2O_6$, $Zn_2SiO_4$, or the like, or a combination including at least one of the foregoing silicates.

Examples of borides are lanthanum boride ($LaB_6$), cerium boride ($CeB_6$), strontium boride ($SrB_6$), aluminum boride, calcium boride ($CaB_6$), titanium boride ($TiB_2$), zirconium boride ($ZrB_2$), vanadium boride ($VB_2$), tantalum boride ($TaB_2$), chromium borides (CrB and $CrB_2$), molybdenum borides ($MoB_2$, $Mo_2B_5$ and MoB), tungsten boride ($W_2B_5$), or the like, or a combination including at least one of the foregoing borides.

Examples of carbides are silicon carbide, tungsten carbide, tantalum carbide, iron carbide, titanium carbide, or the like, or a combination including at least one of the foregoing carbides.

Examples of nitrides include silicon nitride, boron nitride, titanium nitride, aluminum nitride, molybdenum nitride, or the like, or a combination including at least one of the foregoing nitrides.

Examples of perovskites and perovskite derivatives include barium titanate ($BaTiO_3$), strontium titanate ($SrTiO_3$), barium strontium titanate, strontium-doped lanthanum manganate, lanthanum aluminum oxides ($LaAlO_3$), calcium copper titanate ($CaCu_3Ti_4O_{12}$), cadmium copper titanate ($CdCu_3Ti_4O_{12}$), $Ca_{1-x}La_xMnO_3$, (Li, Ti) doped NiO, lanthanum strontium copper oxides (LSCO), yttrium barium copper oxides ($YBa_2Cu_3O_7$), lead zirconate titanate, lanthanum-modified lead zirconate titanate, or the like, or a combination including at least one of the foregoing perovskites and perovskite derivatives.

The amount of the ceramic filler used in the thermoplastic compositions of the present invention may be based on the selected properties of the thermoplastic compositions as well as molded articles made from these compositions. Other factors include the type and/or amount of the LDS additive used and/or the type and/or amount of the thermoplastic resin used. In one embodiment, the ceramic filler is present in amounts of from 10 to 80 wt. %. In another embodiment, the ceramic filler is present in amounts from 20 to 70 wt. %. In still another embodiment, the ceramic filler is present in amounts from 30 to 60 wt. %.

In addition to the thermoplastic resin, the LDS additive, and the ceramic filler, the thermoplastic compositions of the present invention may include various additives ordinarily incorporated in resin compositions of this type. Mixtures of additives may be used. Such additives may be mixed at a suitable time during the mixing of the components for forming the composition. The one or more additives are included in the thermoplastic compositions to impart one or more selected characteristics to the thermoplastic compositions and any molded article made therefrom. Examples of additives that may be included in the present invention include, but are not limited to, heat stabilizers, process stabilizers, antioxidants, light stabilizers, plasticizers, antistatic agents, mold releasing agents, UV absorbers, lubricants, pigments, dyes, colorants, flow promoters or a combination of one or more of the foregoing additives.

Suitable heat stabilizers include, for example, organo phosphites such as triphenyl phosphite, tris-(2,6-dimethylphenyl)phosphite, tris-(mixed mono-and di-nonylphenyl) phosphite or the like; phosphonates such as dimethylbenzene phosphonate or the like, phosphates such as trimethyl phosphate, or the like, or combinations including at least one of the foregoing heat stabilizers. Heat stabilizers are generally used in amounts of from 0.01 to 0.5 parts by weight based on 100 parts by weight of the total composition, excluding any filler.

Suitable antioxidants include, for example, organophosphites such as tris(nonyl phenyl)phosphite, tris(2,4-di-t-butylphenyl)phosphite, bis(2,4-di-t-butylphenyl)pentaerythritol diphosphite, distearyl pentaerythritol diphosphite or the like; alkylated monophenols or polyphenols; alkylated reaction products of polyphenols with dienes, such as tetrakis [methylene(3,5-di-tert-butyl-4-hydroxyhydrocinnamate)] methane, or the like; butylated reaction products of para-cresol or dicyclopentadiene; alkylated hydroquinones; hydroxylated thiodiphenyl ethers; alkylidene-bisphenols; benzyl compounds; esters of beta-(3,5-di-tert-butyl-4-hydroxyphenyl)-propionic acid with monohydric or polyhydric alcohols; esters of beta-(5-tert-butyl-4-hydroxy-3-methylphenyl)-propionic acid with monohydric or polyhydric alcohols; esters of thioalkyl or thioaryl compounds such as distearylthiopropionate, dilaurylthiopropionate, ditridecylthiodipropionate, octadecyl-3-(3,5-di-tert-butyl-4-hydroxyphenyl)propionate, pentaerythrityl-tetrakis[3-(3,5-di-tert-butyl-4-hydroxyphenyl)propionate or the like; amides of beta-(3,5-di-tert-butyl-4-hydroxyphenyl)-propionic acid or the like, or combinations including at least one of the foregoing antioxidants. Antioxidants are generally used in amounts of from 0.01 to 0.5 parts by weight, based on 100 parts by weight of the total composition, excluding any filler.

Suitable light stabilizers include, for example, benzotriazoles such as 2-(2-hydroxy-5-methylphenyl)benzotriazole, 2-(2-hydroxy-5-tert-octylphenyl)-benzotriazole and 2-hydroxy-4-n-octoxy benzophenone or the like or combinations including at least one of the foregoing light stabilizers. Light stabilizers are generally used in amounts of from 0.1 to 1.0 parts by weight, based on 100 parts by weight of the total composition, excluding any filler.

Suitable plasticizers include, for example, phthalic acid esters such as dioctyl-4,5-epoxy-hexahydrophthalate, tris-(octoxycarbonylethyl)isocyanurate, tristearin, epoxidized soybean oil or the like, or combinations including at least one of the foregoing plasticizers. Plasticizers are generally used in amounts of from 0.5 to 3.0 parts by weight, based on 100 parts by weight of the total composition, excluding any filler.

Suitable antistatic agents include, for example, glycerol monostearate, sodium stearyl sulfonate, sodium dodecylbenzenesulfonate or the like, or combinations of the foregoing antistatic agents. In one embodiment, carbon fibers, carbon nanofibers, carbon nanotubes, carbon black, or any combination of the foregoing may be used in a polymeric resin containing chemical antistatic agents to render the composition electrostatically dissipative.

Suitable mold releasing agents include for example, metal stearate, stearyl stearate, pentaerythritol tetrastearate, beeswax, montan wax, paraffin wax, or the like, or combinations including at least one of the foregoing mold release agents. Mold releasing agents are generally used in amounts of from 0.1 to 1.0 parts by weight, based on 100 parts by weight of the total composition, excluding any filler.

Suitable UV absorbers include for example, hydroxybenzophenones; hydroxybenzotriazoles; hydroxybenzotriazines; cyanoacrylates; oxanilides; benzoxazinones; 2-(2H-benzotriazol-2-yl)-4-(1,1,3,3-tetramethylbutyl)-phenol (CYASORB™ 5411); 2-hydroxy-4-n-octyloxybenzophenone (CYASORB™ 531); 2-[4,6-bis(2,4-dimethylphenyl)-1,3,5-triazin-2-yl]-5-(octyloxy)-phenol (CYASORB™ 1164); 2,2'-(1,4-phenylene)bis(4H-3,1-benzoxazin-4-one) (CYASORB™ UV-3638); 1,3-bis[(2-cyano-3,3-diphenylacryloyl) oxy]-2,2-bis[[(2-cyano-3,3-diphenylacryloyl)oxy]methyl] propane (UVINUL™ 3030); 2,2'-(1,4-phenylene) bis(4H-3,1-benzoxazin-4-one); 1,3-bis[(2-cyano-3,3-diphenylacryloyl)oxy]-2,2-bis[[(2-cyano-3,3-diphenylacryloyl)oxy]methyl]propane; nano-size inorganic materials such as titanium oxide, cerium oxide, and zinc oxide, all with particle size less than 100 nanometers; or the like, or combinations including at least one of the foregoing UV absorbers. UV absorbers are generally used in amounts of from 0.01 to 3.0 parts by weight, based on 100 parts by weight based on 100 parts by weight of the total composition, excluding any filler.

Suitable lubricants include for example, fatty acid esters such as alkyl stearyl esters, e.g., methyl stearate or the like; mixtures of methyl stearate and hydrophilic and hydrophobic surfactants including polyethylene glycol polymers, polypropylene glycol polymers, and copolymers thereof e.g., methyl stearate and polyethylene-polypropylene glycol copolymers in a suitable solvent; or combinations including at least one of the foregoing lubricants. Lubricants are generally used in amounts of from 0.1 to 5 parts by weight, based on 100 parts by weight of the total composition, excluding any filler.

Suitable pigments include for example, inorganic pigments such as metal oxides and mixed metal oxides such as zinc oxide, titanium dioxides, iron oxides or the like; sulfides such as zinc sulfides, or the like; aluminates; sodium sulfo-silicates; sulfates and chromates; carbon blacks; zinc ferrites; ultramarine blue; Pigment Brown 24; Pigment Red 101; Pigment Yellow 119; organic pigments such as azos, di-azos, quinacridones, perylenes, naphthalene tetracarboxylic acids, flavanthrones, isoindolinones, tetrachloroisoindolinones, anthraquinones, anthanthrones, dioxazines, phthalocyanines, and azo lakes; Pigment Blue 60, Pigment Red 122, Pigment Red 149, Pigment Red 177, Pigment Red 179, Pigment Red 202, Pigment Violet 29, Pigment Blue 15, Pigment Green 7, Pigment Yellow 147 and Pigment Yellow 150, or combinations including at least one of the foregoing pigments. Pigments are generally used in amounts of from 1 to 10 parts by weight, based on 100 parts by weight based on 100 parts by weight of the total composition, excluding any filler.

Suitable dyes include, for example, organic dyes such as coumarin 460 (blue), coumarin 6 (green), nile red or the like; lanthanide complexes; hydrocarbon and substituted hydrocarbon dyes; polycyclic aromatic hydrocarbons; scintillation dyes (preferably oxazoles and oxadiazoles); aryl- or heteroaryl-substituted poly (2-8 olefins); carbocyanine dyes; phthalocyanine dyes and pigments; oxazine dyes; carbostyryl dyes; porphyrin dyes; acridine dyes; anthraquinone dyes; arylmethane dyes; azo dyes; diazonium dyes; nitro dyes; quinone imine dyes; tetrazolium dyes; thiazole dyes; perylene dyes, perinone dyes; bis-benzoxazolylthiophene (BBOT); and xanthene dyes; fluorophores such as anti-stokes shift dyes which absorb in the near infrared wavelength and emit in the visible wavelength, or the like; luminescent dyes such as 5-amino-9-diethyliminobenzo(a)phenoxazonium perchlorate; 7-amino-4-methylcarbostyryl; 7-amino-4-methylcoumarin; 3-(2'-benzimidazolyl)-7-N,N-diethylaminocoumarin; 3-(2'-benzothiazolyl)-7-diethylaminocoumarin; 2-(4-biphenylyl)-5-(4-t-butylphenyl)-1,3,4-oxadiazole; 2-(4-biphenyl)-6-phenylbenzoxazole-1,3; 2,5-Bis-(4-biphenylyl)-1,3,4-oxadiazole; 2,5-bis-(4-biphenylyl)-oxazole; 4,4'-bis-(2-butyloctyloxy)-p-quaterphenyl; p-bis(o-methylstyryl)-benzene; 5,9-diaminobenzo(a)phenoxazonium perchlorate; 4-dicyanomethylene-2-methyl-6-(p-dimethylaminostyryl)-4H-pyran; 1,1'-diethyl-2,2'-carbocyanine iodide; 3,3'-diethyl-4,4',5,5'-dibenzothiatricarbocyanine iodide; 7-diethylamino-4-methylcoumarin; 7-diethylamino-4-trifluoromethylcoumarin; 2,2'-dimethyl-p-quaterphenyl; 2,2-dimethyl-p-terphenyl; 7-ethylamino-6-methyl-4-trifluoromethylcoumarin; 7-ethylamino-4-trifluoromethylcoumarin; nile red; rhodamine 700; oxazine 750; rhodamine 800; IR 125; IR 144; IR 140; IR 132; IR 26; IR5; diphenylhexatriene; diphenylbutadiene; tetraphenylbutadiene; naphthalene; anthracene; 9,10-diphenylanthracene; pyrene; chrysene; rubrene; coronene; phenanthrene or the like, or combinations including at least one of the foregoing dyes. Dyes are generally used in amounts of from 0.1 to 5 parts by weight, based on 100 parts by weight of the total composition, excluding any filler.

Suitable colorants include, for example titanium dioxide, anthraquinones, perylenes, perinones, indanthrones, quinacridones, xanthenes, oxazines, oxazolines, thioxanthenes, indigoids, thioindigoids, naphthalimides, cyanines, xanthenes, methines, lactones, coumarins, bis-benzoxazolylthiophene (BBOT), naphthalenetetracarboxylic derivatives, monoazo and disazo pigments, triarylmethanes, aminoketones, bis(styryl)biphenyl derivatives, and the like, as well as combinations including at least one of the foregoing colorants. Colorants are generally used in amounts of from 0.1 to 5 parts by weight, based on 100 parts by weight of the total composition, excluding any filler.

Suitable blowing agents include for example, low boiling halohydrocarbons and those that generate carbon dioxide; blowing agents that are solid at room temperature and when heated to temperatures higher than their decomposition temperature, generate gases such as nitrogen, carbon dioxide, ammonia gas, such as azodicarbonamide, metal salts of azodicarbonamide, 4,4'oxybis(benzenesulfonylhydrazide), sodium bicarbonate, ammonium carbonate, or the like, or combinations including at least one of the foregoing blowing agents. Blowing agents are generally used in amounts of from 1 to 20 parts by weight, based on 100 parts by weight of the total composition, excluding any filler.

Additionally, materials to improve flow and other properties may be added to the composition, such as low molecular weight hydrocarbon resins. Particularly useful classes of low molecular weight hydrocarbon resins are those derived from petroleum $C_5$ to $C_9$ feedstock that are derived from unsaturated $C_5$ to $C_9$ monomers obtained from petroleum cracking. Non-limiting examples include olefins, e.g. pentenes, hexenes, heptenes and the like; diolefins, e.g. pentadienes, hexadienes and the like; cyclic olefins and diolefins, e.g. cyclopentene, cyclopentadiene, cyclohexene, cyclohexadiene, methyl cyclopentadiene and the like; cyclic diolefin dienes, e.g., dicyclopentadiene, methylcyclopentadiene dimer and the like; and aromatic hydrocarbons, e.g. vinyltoluenes, indenes, methylindenes and the like. The resins can additionally be partially or fully hydrogenated.

Lastly, the compositions of the present invention may, in alternative embodiments, include one or more reinforcement fillers. These fillers may be selected to impart additional impact strength and/or provide additional characteristics that may be based on the final selected characteristics of the thermoplastic compositions. Suitable fillers or reinforcing agents include, for example, $TiO_2$; fibers, such as asbestos or the like; silicates and silica powders, such as aluminum silicate (mullite), synthetic calcium silicate, zirconium silicate, fused silica, crystalline silica graphite, natural silica sand, or the like; boron powders such as boron-nitride powder, boron-silicate powders, or the like; alumina; magnesium oxide (magnesia); calcium sulfate (as its anhydride, dihydrate or trihydrate); calcium carbonates such as chalk, limestone, marble, synthetic precipitated calcium carbonates, or the like; talc, including fibrous, modular, needle shaped, lamellar talc, or the like; wollastonite; surface-treated wollastonite; glass spheres such as hollow and solid glass spheres, silicate spheres, cenospheres, aluminosilicate (armospheres), or the like; kaolin, including hard kaolin, soft kaolin, calcined kaolin, kaolin including various coatings known in the art to facilitate compatibility with the polymeric matrix resin, or the like; single crystal fibers or "whiskers" such as silicon carbide, alumina, boron carbide, iron, nickel, copper, or the like; glass fibers, (including continuous and chopped fibers), such as E, A, C, ECR, R, S, D, and NE glasses and quartz, or the like; sulfides such as molybdenum sulfide, zinc sulfide or the like; barium compounds such as barium titanate, barium ferrite, barium sulfate, heavy spar, or the like; metals and metal oxides such as particulate or fibrous aluminum, bronze, zinc, copper and nickel or the like; flaked fillers such as glass flakes, flaked silicon carbide, aluminum diboride, aluminum flakes, steel flakes or the like; fibrous fillers, for example short inorganic fibers such as those derived from blends including at least one of aluminum silicates, aluminum oxides, magnesium oxides, and calcium sulfate hemihydrate or the like; natural fillers and reinforcements, such as wood flour obtained by pulverizing wood, fibrous products such as cellulose, cotton, sisal, jute, starch, cork flour, lignin, ground nut shells, corn, rice grain husks or the like; reinforcing organic fibrous fillers formed from organic polymers capable of forming fibers such as poly(ether ketone), polyimide, polybenzoxazole, poly(phenylene sulfide), polyesters, polyethylene, aromatic polyamides, aromatic polyimides, polyetherimides, polytetrafluoroethylene, acrylic resins, poly(vinyl alcohol) or the like; as well as additional fillers and reinforcing agents such as mica, clay, feldspar, flue dust, fillite, quartz, quartzite, perlite, tripoli, diatomaceous earth, carbon black, or the like, or combinations including at least one of the foregoing fillers or reinforcing agents.

The fillers and reinforcing agents may be coated surface treated with silanes to improve adhesion and dispersion with the polymeric matrix resin. In addition, the reinforcing fillers may be provided in the form of monofilament or multifilament fibers and may be used either alone or in combination with other types of fiber, through, for example, co-weaving or core/sheath, side-by-side, orange-type or matrix and fibril constructions, or by other methods known to one skilled in the art of fiber manufacture. Fibrous fillers may be supplied in the form of, for example, rovings, woven fibrous reinforcements, such as 0-90 degree fabrics or the like; non-woven fibrous reinforcements such as continuous strand mat, chopped strand mat, tissues, papers and felts or the like; or three-dimensional reinforcements such as braids. Fillers are generally used in amounts of from 1 to 50 parts by weight, based on 100 parts by weight of the total composition.

The thermoplastic compositions of the present invention may be formed using any known method of combining multiple components to form a thermoplastic resin. In one embodiment, the components are first blended in a high-speed mixer. Other low shear processes including but not limited to hand mixing may also accomplish this blending. The blend is then fed into the throat of a twin-screw extruder via a hopper. Alternatively, one or more of the components may be incorporated into the composition by feeding directly into the extruder at the throat and/or downstream through a sidestuffer. The extruder is generally operated at a temperature higher than that necessary to cause the composition to flow. The extrudate is immediately quenched in a water batch and pelletized. The pellets so prepared when cutting the extrudate may be one-fourth inch long or less as desired. Such pellets may be used for subsequent molding, shaping, or forming.

Shaped, formed, or molded articles including the thermoplastic compositions are also provided. The thermoplastic compositions can be molded into useful shaped articles by a variety of means such as injection molding, extrusion, rotational molding, blow molding and thermoforming to form articles such as, for example, personal computers, notebook and portable computers, cell phone antennas and other such communications equipment, medical applications, RFID applications, automotive applications, and the like.

The present invention is further illustrated by the following non-limiting examples.

EXAMPLES

In these examples, the effect of an LDS additive (copper chromium oxide spinel) on the dielectric constant and platability of a polymer/ceramic filler composition was examined. In these examples, the polymer base resin was a poly (arylene ether) (NORYL® PPO available from SABIC Innovative Plastics) and the ceramic filler was selected from BaTiO3 (available from Wuxi Nobel Electronics Co. Ltd.) and TiO2 (available from DuPont) and mixtures thereof. The ratio of BaTiO3 to TiO2 was 39/21. The LDS additive was a copper chromium spinel (PK3095 available from Ferro Far East Limited). The effects of the LDS additive on the platability and the specific gravity may be seen in Table 1.

The qualitative adhesion test (ASTM D3359-93) was used to determine whether the material was capable of being plated. The test method (ASTM D3359-93) required the formation of an X-cut in the plating of conductive metal applied to the laser etched areas. Pressure sensitive tape, applied over the X-cut, provides a qualitative measure of metal-to-substrate adhesion where removed from the test material. After removal of the test tape, the metal-to-substrate adhesion may be assessed using a suitable scale to indicate release or retention of metal. Also the adhesion or bonding quality of plated metal to the surface was measured using the procedure outlined in standard test IPC-TM-650. Average peel strength is 4.1 N, and the average adhesion tested is around 1.4 N/mm.

TABLE 1

Effect of copper chromium oxide spinel on the dielectric constant and platability of PPO/BaTiO3/TiO2 compounds.

| Base Resin | Dielectric constant level @ 900 MHz | wt. % ceramic filler needed to achieve given dielectric constant with listed amount of LDS additive and remainder PPO base | | | | Specific gravity | | | | Platability after laser etch | | | |
|---|---|---|---|---|---|---|---|---|---|---|---|---|---|
| | | w/o PK3095 | 5% PK3095 | 10% PK3095 | 20% PK3095 | w/o PK3095 | 5% PK3095 | 10% PK3095 | 20% PK3095 | w/o PK3095 | 5% Pk3095 | 10% PK3095 | 20% PK3095 |
| PPO base | 4.1 | 40% | 30% | 25% | | 1.38 | 1.36 | 1.35 | | cannot be plated | can be plated with optimized laser parameters | good | |
| | 4.7 | 50% | 35% | 32.5% | | 1.75 | 1.71 | 1.69 | | cannot be plated | can be plated with | good | |

TABLE 1-continued

Effect of copper chromium oxide spinel on the dielectric constant and platability of PPO/BaTiO3/TiO2 compounds.

| Base Resin | Dielectric constant level @ 900 MHz | wt. % ceramic filler needed to achieve given dielectric constant with listed amount of LDS additive and remainder PPO base | | | | Specific gravity | | | | Platability after laser etch | | | |
|---|---|---|---|---|---|---|---|---|---|---|---|---|---|
| | | w/o PK3095 | 5% PK3095 | 10% PK3095 | 20% PK3095 | w/o PK3095 | 5% PK3095 | 10% PK3095 | 20% PK3095 | w/o PK3095 | 5% Pk3095 | 10% PK3095 | 20% PK3095 |
| | 6.1 | 60% | 52% | 45% | | 1.85 | 1.82 | 1.8 | | cannot be plated | optimized laser parameters can be plated with optimized laser parameters | good | |
| | 6.7 | cannot achieve | cannot achieve | 55% | 40 | / | / | 2.06 | 2.02 | / | / | good | good |

As may be seen, without the copper chromium oxide spinel additive, the compounds cannot be plated at all after laser etching. But when copper chromium oxide spinel was added, the copper could be plated and copper strike was able to pass tape-peel testing. Also, increasing the amount of the additive increased the platability of the materials.

Also, as may be seen in Table 1, without the copper chromium oxide spinel additive, to achieve dielectric constant level to 4.1, 40% of the ceramic filler needed to be added. However, to achieve the same level of dielectric constant, when 10% of the copper chromium oxide spinel was added, only 25% by weight of the ceramic fillers needed to be added. As a result, the total of the filler loading (copper chromium oxide spinel+ceramic filler) is reduced with the use of the LDS additive to achieve the same level of dielectric constant. As a result, the specific gravity was lower compared to when no copper chromium oxide spinel was added. This trend was seen in compounds having a 4.7 dielectric constant and a 6.1 dielectric constant. In the presence of copper chromium oxide spinel, lower loading of ceramic fillers was needed to achieve the same level of dielectric constant, thereby resulting in compositions having a lower specific gravity. In addition, without the copper chromium spinel, PPO/ceramic filler compounds cannot achieve Dk to 6.7. However, as can be seen, this high level of Dk can be reached with only 40 wt % ceramic fillers in PPO/ceramic filler compounds when 20 wt % of copper chromium oxide spinel is included. In addition, the resulting materials are also laser etchable and platable.

Copper chromium oxide spinel alone cannot increase the dielectric constant of polymer much. With 5% and 10% copper chromium oxide, dielectric constant of 2.6 (neat PPO level) can only be achieved. But the combination of the copper chromium oxide spinel additive can increase the dielectric constant when ceramic fillers were added, while also giving the benefit of platability after laser etching of the final products.

Additional experiments on other resins with different polarity, such as PA66 and PPA based high dielectric constant were studied. The PA66 was A27E01 from BASF Corp and the PPA was A model AS-1566HS BK 324 from Solvay. As with PPO as the base resin, compounds of PA66 or PPA and ceramic fillers alone could not be plated at all. But with the addition of the copper chromium oxide spinel, the materials could be plated easily. In these compounds, the loading of copper chromium oxide spinel could be lower than 5% to still achieve these platability characteristics.

For PA66/ceramic filler compounds, the presence of the copper chromium oxide spinel additive also reduced the ceramic filler loading to different level depending on the level of dielectric constant, as shown in Table 2. These results were consistent with those for the PPO resin as previously discussed. As with the PPO based resins, the total filler loading (ceramic filler+copper chromium oxide spinel) is reduced to achieve the same level of dielectric constant by using the LDS additive. These phenomena can also be observed in PPA/ceramic filler compounds.

TABLE 2

Effect of copper chromium oxide spinel on the dielectric constant and platability of PA/BaTiO3/TiO2 compounds.

| Base Resin | Dielectric constant level @ 900 MHz | wt. % ceramic filler needed to achieve given dielectric constant with amount of LDS additive and remainder PA base | | Specific gravity | | Platability after laser etch | |
|---|---|---|---|---|---|---|---|
| | | w/o PK3095 | 5% PK3095 | w/o PK3095 | 5% PK3095 | w/o PK3095 | 5% Pk3095 |
| PA base | 4.1 | 25% | 15% | 1.4 | 1.37 | cannot be plated | good |
| | 4.8 | 40% | 25% | 1.62 | 1.48 | cannot be plated | good |

TABLE 2-continued

Effect of copper chromium oxide spinel on the dielectric constant and platability of PA/BaTiO3/TiO2 compounds.

| Base Resin | Dielectric constant level @ 900 MHz | wt. % ceramic filler needed to achieve given dielectric constant with amount of LDS additive and remainder PA base | | Specific gravity | | Platability after laser etch | |
|---|---|---|---|---|---|---|---|
| | | w/o PK3095 | 5% PK3095 | w/o PK3095 | 5% PK3095 | w/o PK3095 | 5% Pk3095 |
| | 6 | 45% | 35% | 1.77 | 1.65 | cannot be plated | good |

Table 3 shows similar synergy effect of copper chromium oxide spinel in PPO/PA/ceramic filler compounds. As may be seen, similar effects are seen with blends of PPO and PA as were seen in PPO only and PA only embodiments.

TABLE 3

Effect of copper chromium oxide spinel on the dielectric constant and platability of PPO/PA/BaTiO3/TiO2 compounds.

| Base Resin | Dielectric constant level @ 900 MHz | wt. % ceramic filler needed to achieve given dielectric constant with amount of LDS additive and remainder PPO/PA blend | | Specific gravity | | Platability after laser etch | |
|---|---|---|---|---|---|---|---|
| | | w/o PK3095 | 5% PK3095 | w/o PK3095 | 5% PK3095 | w/o PK3095 | 5% Pk3095 |
| PPO/PA blend | 4.3 | 40 | 32 | 1.5 | 1.41 | cannot be plated | good |
| | 5.4 | 50 | 40 | 1.74 | 1.61 | cannot be plated | good |
| | 6.8 | 60 | 50 | 1.85 | 1.78 | cannot be plated | good |

In the next set of examples, the effects of other LDS additives were examined. In these examples, copper molybdenum oxide (CMO) available from Tokan Material Technology Co. Ltd. and it showed a similar synergy effect on Dk of polymer/ceramic filler compounds. For PA66/ceramic filler compounds, the presence of CMO can also reduce the ceramic filler loading to different level depending on the level of dielectric constant, as shown in Table 4.

While typical embodiments have been set forth for the purpose of illustration, the foregoing descriptions should not be deemed to be a limitation on the scope of the invention. Accordingly, various modifications, adaptations, and alternatives may occur to one skilled in the art without departing from the spirit and scope of the present invention.

What is claimed is:

1. A thermoplastic composition, comprising:
a) from 10 to 90% by weight of a thermoplastic base resin;
b) from 0.1 to 30% by weight of a laser direct structuring additive; and

TABLE 4

Effect of copper molybdenum oxide on the dielectric constant and platability of PA/BaTiO3/TiO2 compounds.

| Base Resin | Dielectric constant level @ 900 MHz | wt. % ceramic filler needed to achieve given dielectric constant with amount of LDS additive and remainder PA resin | | Specific gravity | | Platability after laser etch | |
|---|---|---|---|---|---|---|---|
| | | w/o CMO | 5% CMO | w/o CMO | 5% CMO | w/o CMO | 5% CMO |
| PA base | 4.1 | 25% | 10% | 1.4 | 1.32 | cannot be plated | good |
| | 4.8 | 40% | 20% | 1.62 | 1.41 | cannot be plated | good |
| | 6 | 45% | 30% | 1.77 | 1.53 | cannot be plated | good | c) 10 to 80% or less by weight of at least one ceramic filler, wherein the at least one ceramic filler has a dielectric constant of 25 or greater when measured at 900 MHz or greater and is selected from metal oxides, silicates, borides, carbides, nitrides, perovskites, perovskite derivatives, or a combination including at least one of the foregoing ceramic fillers having a dielectric constant of 25 or greater when measured at 900 MHz, and wherein the metal oxides are selected from zirconates, titanates, stannates, niobates, tantalates, rare earth oxides, antimony oxides, vanadium oxides, iron oxides, strontium oxides, copper oxide, niobium oxide, tantalum oxide, yttrium oxide, $CaTiO_3$, $MgZrSrTiO_6$, $MgTiO_3$, $MgAl_2O_4$, $BaZrO_3$, $BaSnO_3$, $BaNb_2O_6$, $BaTa_2O_6$, $WO_3$, $MnO_2$, $SrZrO_3$, $SnTiO_4$, $ZrTiO_4$, $CaZrO_3$, $CaSnO_3$, $CaWO_4$, $MgTa_2O_6$, $MgZrO_3$, $La_2O_3$, $CaZrO_3$, $MgSnO_3$, $MgNb_2O_6$, $SrNb_2O_6$, $MgTa_2O_6$, $Ta_2O_3$, or a combination including at least one of the foregoing metal oxides, and the silicates are selected from $Na_2SiO_3$, $Li_4SiO_4$, $BaTiSi_3O_9$, $ZrSiO_4$, $CaMgSi_2O_6$, $Zn_2SiO_4$, or a combination including at least one of the foregoing silicates;

wherein the thermoplastic composition is capable of being plated after being activated using a laser, and wherein the composition has a dielectric constant of 4 or greater and a loss tangent of 0.01 or less.

2. The thermoplastic composition of claim 1, wherein the thermoplastic base resin is a polyamide, a poly(arylene ether), a polyphthalamide or a combination including at least one of the foregoing thermoplastic base resins.

3. The thermoplastic composition of claim 1, wherein the laser direct structuring additive is a heavy metal mixture oxide spinel, a copper salt, or a combination including at least one of the foregoing laser direct structuring additives.

4. The thermoplastic composition of claim 3, wherein the laser direct structuring additive comprises copper chromium oxide spinel.

5. The thermoplastic composition of claim 1, wherein the at least one ceramic filler is silicates, borides, carbides, nitrides, perovskites and perovskite derivatives, or a combination including at least one of the foregoing fillers having a dielectric constant of 25 or greater when measured at 900 MHz.

6. An article of manufacture comprising the composition of claim 1.

7. The article of claim 6, wherein the article is a personal computer, a notebook computer, a portable computer, a cell phone, a medical device, an automotive application, or an RFID application.

\* \* \* \* \*